United States Patent [19]
Neal et al.

[11] Patent Number: 5,980,281
[45] Date of Patent: Nov. 9, 1999

[54] MECHANISM TO ASSIST IN INSERTION OR REMOVAL OF PCI CARDS

[75] Inventors: Danny M. Neal, Round Rock; James R. Taylor, Leander; Walter D. Scott, Austin; Ciro N. Ramirez, Round Rock, all of Tex.

[73] Assignee: International Business Machines Corporation, Armonk, N.Y.

[21] Appl. No.: 09/022,307

[22] Filed: Feb. 11, 1998

[51] Int. Cl.⁶ .................................................. H01R 13/62
[52] U.S. Cl. ............................................ 439/157; 439/342
[58] Field of Search .................................... 439/152, 157, 439/159, 160, 342

[56] References Cited

U.S. PATENT DOCUMENTS

| | | | |
|---|---|---|---|
| 4,846,699 | 7/1989 | Glover et al. | 439/157 |
| 5,140,501 | 8/1992 | Takahashi et al. | 439/157 |
| 5,205,753 | 4/1993 | Butterfield et al. | 439/157 |
| 5,238,423 | 8/1993 | Hillis et al. | 439/342 |
| 5,657,204 | 8/1997 | Hunt | 361/752 |
| 5,675,475 | 10/1997 | Mazura et al. | 439/157 |
| 5,793,614 | 8/1998 | Tollbom | 439/157 |
| 5,815,377 | 9/1998 | Lund et al. | 439/342 |

*Primary Examiner*—Steven L. Stephan
*Assistant Examiner*—Hae Moon Hyeon
*Attorney, Agent, or Firm*—Volel Emile; James E. Bradley; Andrew J. Dillon

[57] ABSTRACT

A board-handling mechanism for more easily installing and removing boards from motherboards and/or other mountings within system enclosures such that it does not require the removal of the enclosure. The mechanism provides leverage to positively unseat circuit boards mounted into system connectors on the motherboard or other locations within system enclosures. A gripping mechanism is used for gripping one edge of the circuit board during the unseating process. The gripping mechanism is particularly adapted to provide additional force to unseat the circuit board. The gripping mechanism is adjustably mounted for accommodating circuit boards of various sizes.

17 Claims, 5 Drawing Sheets

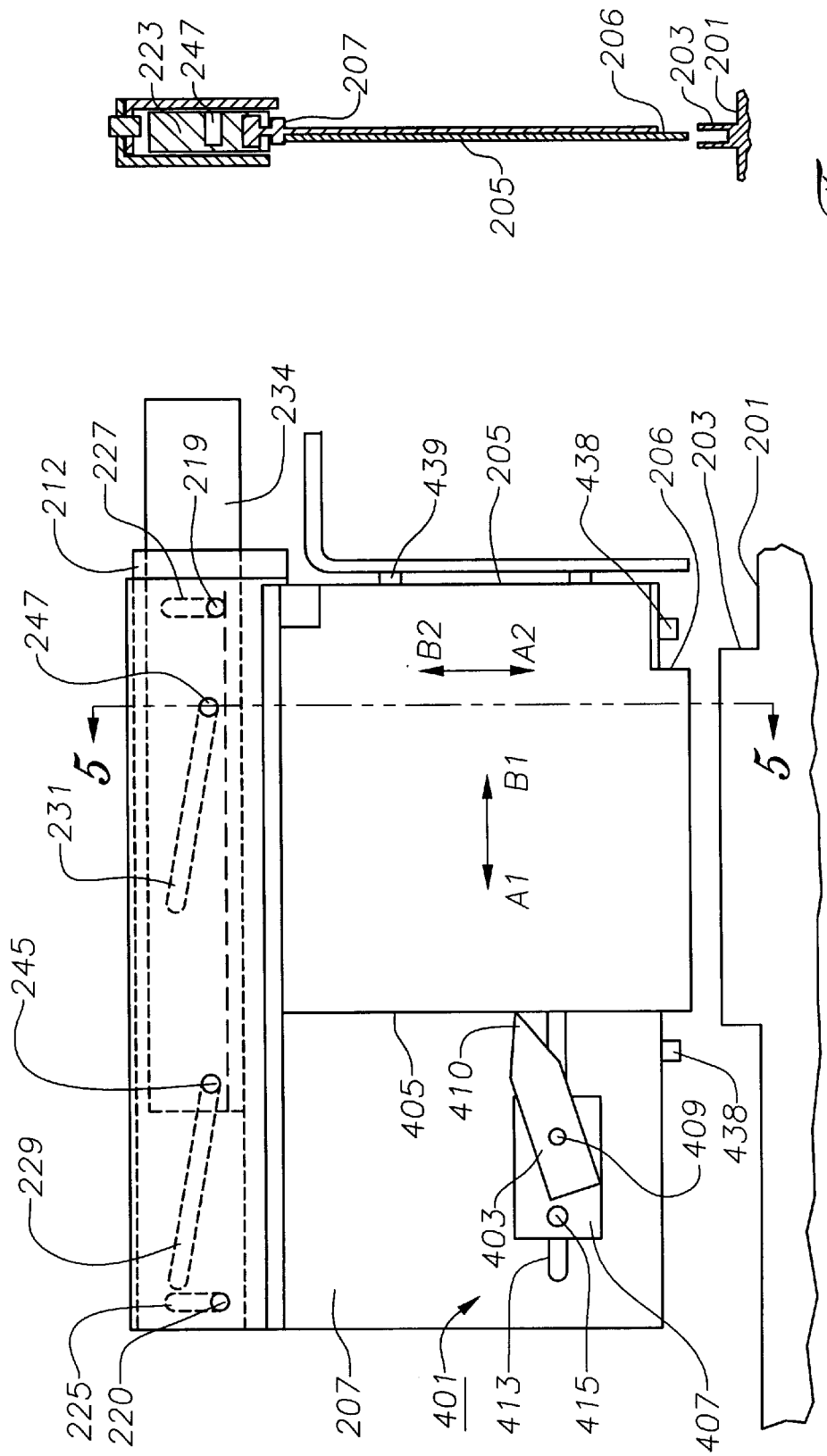

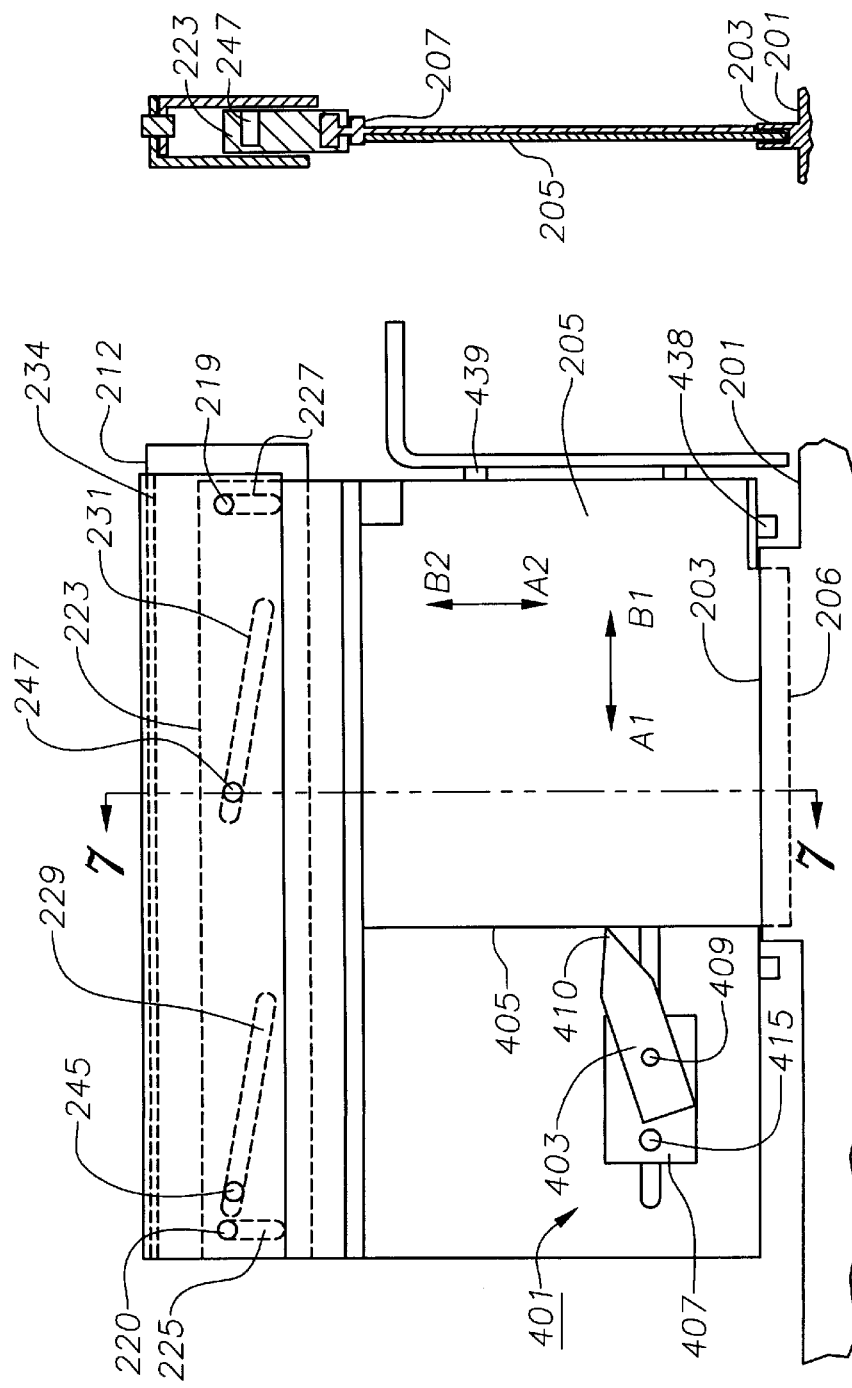

MECHANISM TO ASSIST IN INSERTION OR REMOVAL OF PCI CARDS

CROSS REFERENCE TO RELATED APPLICATION

A related application entitled, *Locating and Guidance Device For Printed Circuit Boards*, filed May 16, 1997, docket number AT9-97-233, and assigned to the assignee of the present application, is incorporated by reference.

TECHNICAL FIELD

The present invention relates generally to printed circuit boards and enclosures therefor, and more particularly to an improved circuit board insertion and extraction mechanism for use in installing and removing circuit boards, such as standard PCI I/O adaptor add-in boards, from system enclosures.

BACKGROUND ART

In computer systems, workstations and other electronics-intensive products and systems, ICs (integrated circuits) including processors, memory systems, controllers, logic circuits together with other system components and ASICs (application specific integrated circuits) are generally mounted on circuit boards within a system enclosure. The circuit boards are, in turn, generally coupled to connector terminals on a main system board or motherboard. The motherboard is typically positioned adjacent to, and mechanically supported by, one of the two major walls or panels of an enclosure because the motherboard is typically the largest board in the enclosure, and also in order to provide a stable support base for smaller circuit boards or so-called daughter boards, which may be inserted into connectors mounted on the motherboards. The daughterboards vary in length and height.

In the prior art, a circuit board was installed into an enclosure by removing the main panel or wall of the enclosure in order to provide access to the connector on the motherboard and also to give an installer the leverage required to apply an in-line force to make certain a solid electrical connection is established and the daughterboard is securely connected. Even as systems are upgraded, and/or new functions or additional functions are implemented on new boards which need to be installed in existing systems and enclosures, or when boards need to be removed for troubleshooting or maintenance, a main panel or side of the electronics system enclosure needs to be fully removed.

In most system environments space is critical. In systems or network environments or host-terminal systems, servers or computer enclosures are usually mounted in close quarters or even in cabinets or equipment racks where access is extremely limited. In such environments, board replacement or installation is a major task since the enclosure needs to be brought out to an open area and one of the main panels has to be removed in order to have access to the motherboard and connectors within the electronics enclosure. In some cases, the server unit may be mounted on a slidable tray support and the server may be slidably removed from its normal operating position, but even in that case, a major panel of the enclosure must be removed to gain access to the enclosed circuit boards. Moreover, certain EMI requirements must be considered and met in connection with any new design for electronics enclosures.

DISCLOSURE OF THE INVENTION

One board-handling mechanism for more easily installing and removing boards from motherboards and/or other mountings within system enclosures, referenced above, does not require the removal of the enclosure. The mechanism provides leverage to positively seat and unseat circuit boards mounted into system connectors on the motherboard or other locations within system enclosures. The gripping mechanism is particularly adapted to provide additional force to unseat the circuit board. A gripping mechanism is used for gripping one edge of the circuit board during the seating and unseating processes. The gripping mechanism is adjustably mounted for accommodating circuit boards of various sizes.

BRIEF DESCRIPTION OF THE DRAWINGS

FIG. 4 is a schematic side view of the guidance device and daughterboard of FIGS. 1 and 2 shown prior to engaging a gripper mechanism constructed in accordance with the invention.

FIG. 5 is a sectional end view of the guidance device and daughterboard of FIGS. 1 and 2 taken along the line 5—5 of FIG. 4.

FIG. 6 is a schematic side view of the guidance device and daughterboard of FIGS. 1 and 2 shown engaged with the gripper mechanism of FIG. 4.

FIG. 7 is a sectional end view of the guidance device and daughterboard of FIGS. 1 and 2 taken along the line 7—7 of FIG. 6.

FIG. 8 is an enlarged side view of a portion of the gripper mechanism of FIG. 4.

BEST MODE FOR CARRYING OUT THE INVENTION

Although the present invention comprises a mechanism for inserting or removing I/O cards into a system enclosure with internal connectors, the invention may be more clearly understood with a thorough discussion of the original equipment locating and guidance device referenced above.

Figure 1:
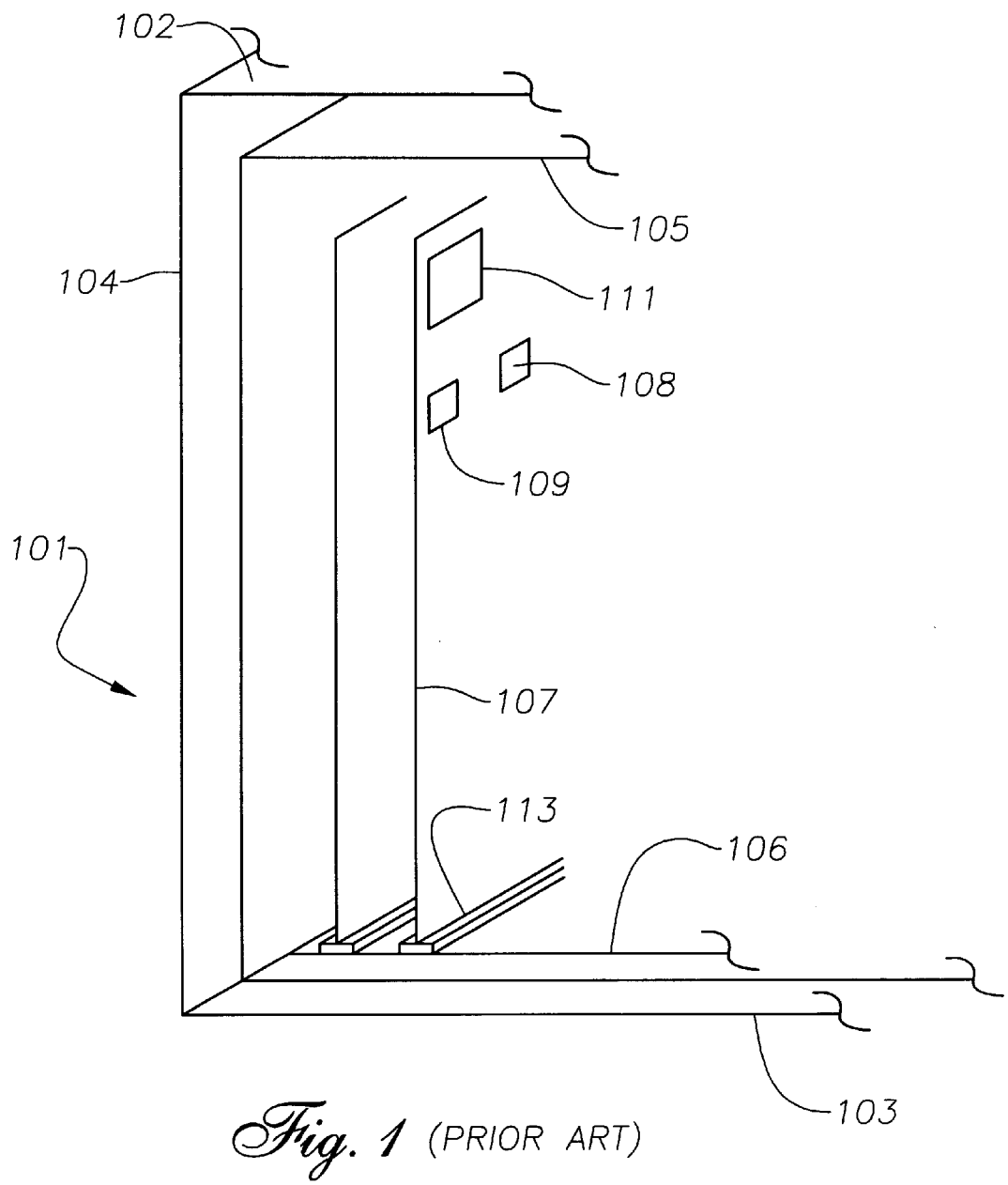
FIG. 1 is a schematic isometric view of a prior art electronics enclosure including a motherboard with daughterboards mounted thereon.

Referring to FIG. 1, a prior art enclosure 101 for housing components of an electronic system, for example, a computer system is shown. The enclosure 101 includes two major panels: a top panel or surface 102 and a bottom panel or surface 103. The enclosure 101 also includes four smaller side panels including side panel or surface 104. A frame 105 is located within enclosure 101.

A base circuit board or motherboard 106 is mounted to frame 105. At least one daughterboard 107, such as a standard PCI I/O add-in board, is mounted into a motherboard connector 113 located on motherboard 106 in a prior art manner. Typically, the daughterboards 107 have integrated circuits or ICs, such as IC 108, IC 109 and IC 111 mounted thereon. The integrated circuits may include memory devices, controller circuits, custom chips, ASICs and the like. The individual integrated circuits and other components mounted on daughterboards 107 are electrically connected to a board connector on board 107 (in the case of PCI, through a PCI interface chip). The board connector is mechanically and electrically fitted into one of the corresponding connectors 113 on the motherboard 106 within the enclosure 101.

In the prior art illustrated in FIG. 1, when daughterboard 107 needs to be pulled from enclosure 101 for replacement or upgrading, the main cover 102 of the system enclosure 101 must be removed to gain access to daughterboards 107. To remove daughterboard 107, it must be pulled in an upward direction to free the daughterboard electrical connector from its corresponding connector 113 on the motherboard 106. In order to insure a solid electrical connection between the motherboard 106 and daughterboard 107, the fit of the daughterboard connector and the motherboard connector is relatively tight and requires a significant amount of force (approximately 15 pounds) to insert or extract daughterboard 107 from its connection on the motherboard. The need for this significant force typically requires the removal of a portion of or the entire top panel 102 from the electronics enclosure 101 to provide room to gain mechanical leverage in installing or removing daughterboards 107.

Figure 2:
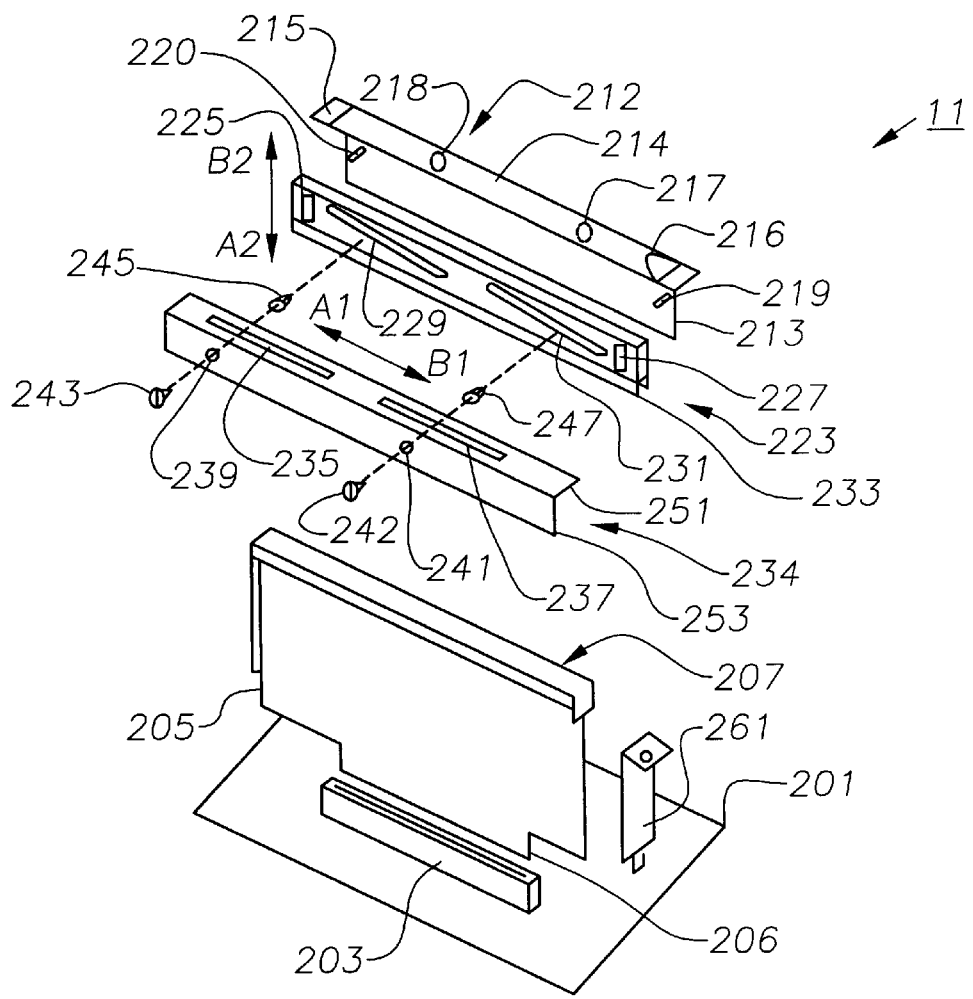
FIG. 2 is an exploded isometric view of a guidance device which is utilized in conjunction with the present invention.

Referring now to FIG. 2, a daughterboard locating and guidance device 11 which is useful in locating, properly aligning, and inserting or removing daughterboards 107 from motherboards is shown. This apparatus permits access to daughterboards 107 from side panels of enclosure 101 (FIG. 1) to insert and remove daughterboards 107 from enclosure 101 without the need for removing a major enclosure panel or transporting the entire enclosure from its operating location to a shop for disassembly.

Guidance device 11 includes a base member 212, an actuating member 223, a slide member 234 and a card or support frame member 207. A motherboard 201 has a motherboard connector 203 which is arranged to receive, and electrically connect with a matching connector 206 on daughterboard 205. Card frame member 207 is essentially a large, rigid rectangular support card mounted to which daughterboard 205 is removably clipped. Card frame member 207 provides a "clipping-on" function such that the frame may be selectively "snapped-on" or "snapped-off" from an upper edge of a standard card or daughterboard 205 in a manner to allow use of standard I/O boards such as PCI I/O boards. Card frame member 207 is selectively coupled to a corresponding gripping device 233 located along the bottom of an actuating member 223 as is hereinafter explained. Other coupling devices may also be used to accomplish the slidable attaching or coupling function between the card frame 207 and the actuating member 223.

Figure 3:
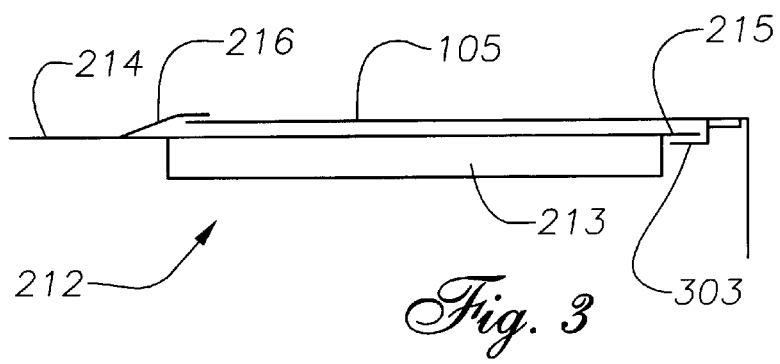
FIG. 3 is a schematic side view of the enclosure of FIG. 1 and an upper end of the guidance device of FIG. 2 which may be used in conjunction with the present invention.

The base member 212 has a side wall 213 and a top surface 214. The top surface 214 further includes a locking tab 215 and a locking clip 216 formed thereon for selective engagement with corresponding locking devices on the frame 105 as shown in detail in FIG. 3. The base member 212 has vertical alignment pins 219 and 220 which are arranged to engage with corresponding vertical alignment slots 227 and 225 of an actuating member 223. The base member 212 also includes first and second horizontal guide pins or bosses 217 and 218 which are arranged to engage with corresponding engagement slots 237 and 235, respectively, of a slide member 234. The actuating member 223 includes first and second follower guide slots 229 and 231 which are downwardly sloping slots relative to the main horizontal axis of the actuating member 223.

The slide member 234 includes first and second guide followers 245 and 247 which are secured to the slide member 234 by means of screws 242, 243 or the like. Screws 242, 243 extend through alignment holes 241, 239 and connect the guide followers 245, 247 to the slide member 234. Guide slots 229, 231 and guide followers 245, 247 provide proper alignment of daughterboard connector 206 with corresponding motherboard connector 203 in a direction which is perpendicular to the planar surface of motherboard 201. This mechanism avoids skewing of daughterboard 205 relative to connector 203. As illustrated, the edge 251 of the slide member 234 will slide near the side wall 213 of the base member 212 above the pins 219 and 220 as slide member 234 is moved along its longitudinal axis in inserting and extracting a daughterboard 205.

An ISA I/O bracket 261 has a card side which is connected to daughterboard 205. Bracket 261 is connected in a conventional manner with rivets, screws or the like, which are fastened through tabs (not shown) located on bracket 261 to the non-conductive substrate body of the daughterboard 205. Bracket 261 is connected on a rearward or B1 side edge of daughterboard 205 which is perpendicular to connector 206.

Bracket 261 is arranged to be grounded to the system bulkhead 421 (FIG. 9) on the outside of an enclosure 423 to provide improved EMI shielding when daughterboard 205 has been inserted into motherboard connector 203 within enclosure 423. As daughterboard 205 is moved into its connected position, the I/O bracket 261 slides along the outside of enclosure opening 421 provided to receive daughterboard 205. In systems designed for autodocking of PCI cards, the bulkhead or enclosure openings 421 are also redesigned to allow insertion of the daughterboards 205 without having to remove enclosure 423. In addition, the bulkhead opening 421 is designed to allow enclosure 423 to provide EMI shield grounding. This approach to EMI shielding allows EMI to be grounded to an outer surface of the bulkhead instead of to an inner surface as is currently done.

Referring again to FIG. 3, the base member 212 is engaged with frame structure 105. The locking tab 215 of the base member 212 is engaged with a holding bar 303 which is shown attached to the frame structure 105. In a similar manner, the locking clip 216 of the base member 212 is slipped over the top of the frame structure 105, thereby locking the base member 212 into a fixed position relative to the frame structure 105. The holding bar 303 is mounted on the frame structure 105 directly above a connector 113 (FIG. 1) on motherboard 106 in order to ensure that daughterboard 205 will be properly aligned with connector 113 when daughterboard 205 is inserted using guidance device 11. The holding bar 303 and frame structure 105 comprise a support means for supporting guidance device 11 relative to motherboard connector 203 and enclosure 101.

Referring now to FIGS. 4 and 6, a gripper mechanism 401 has a pawl or pivotal gripper 403 for engaging a forward edge 405 of daughterboard 205. In FIG. 4, gripper mechanism 401 is shown touching or engaged with forward edge 405. One end of pawl 403 is pivotally mounted to a base portion or plate 407 with a pin 409. Pawl 403 is biased downward by an internal spring member (not shown) which is located and hidden between pawl 403 and base plate 407.

Base plate 407 is mounted in a longitudinal slot 413 in card frame 207. Slot 413 is essentially perpendicular to forward edge 405. A pair of bolts 415 are used to position and rigidly secure base plate 407 in slot 413. Base plate 407 may be adjusted relative to forward edge 405 along the line A1-B1. This adjustability allows gripper mechanism 401 to accommodate daughterboards of varying length. Pawl 403 may be pivoted relative to base 407 between a disengaged position (not shown) and an engaged position (FIGS. 4 and 6) wherein forward edge 405 is lodged against its tip 410. In the engaged position, pawl 403 is inclined slightly upward. As shown in FIG. 4, the rearward or B1 end of pawl 403 has a sharp point at tip 410 for engaging or biting into forward edge 405.

Alternatively, tip 410 may comprise a plurality of teeth or serrations 411 (FIG. 8) to provide a grip on forward edge 405. Serrations 411 point rearward and upward to resist the downward sliding movement of daughterboard 205. As shown in FIG. 8, the upper end of pawl 403' has a length R1 as measured from pin 409. The lower end of pawl 403' has a length R2 which is less than R1. The contact point between serrations 411 and forward edge 405 changes as the gripper 403' moves in an arc, allowing the serrations 411 to bite into leading edge 405.

In operation, daughterboard 205 is loaded or mounted into card frame 207 prior to being installed in enclosure 423. Base plate 407 is positioned along slot 413 to fit daughterboard 205. Pawl 403 is pivoted upward out of engagement with forward edge 405 until daughterboard 205 is properly seated against card frame 207. Pawl 403 is then released and springs downward against forward edge 405 so that point 410 bites into edge 405. The daughterboard 205 and card frame 207 assembly are then inserted into slot 421 and mounted in guidance device 11.

Base member 212 provides a positional reference between card frame 207, motherboard connector 203 and the various components of guidance device 11. Slide member 234 is arranged to slide above the top surface of actuator member 223 so that followers 245, 247 engage slots 229, 231, respectively, thereby forcing actuator member 223 downward. Since actuator member 223 is clipped to card frame 207 and daughterboard 205, daughterboard 205 is forced downward as a user pushes slide member 234 inward. As shown in FIGS. 2, 6 and 7, moving slide member 234 in direction A1 causes a corresponding movement in the actuating member 223 and daughterboard 205 in direction A2 for insertion of daughterboard 205 into connector 203. Similarly, movement of slide member 234 in direction B1 causes actuator member 223 to move in direction B2 (FIGS. 2, 4 and 5), thereby disconnecting daughterboard 205 from connector 203. Pins 219, 220 of base member 212 limit actuator member 223 to vertical movement.

Figure 10:
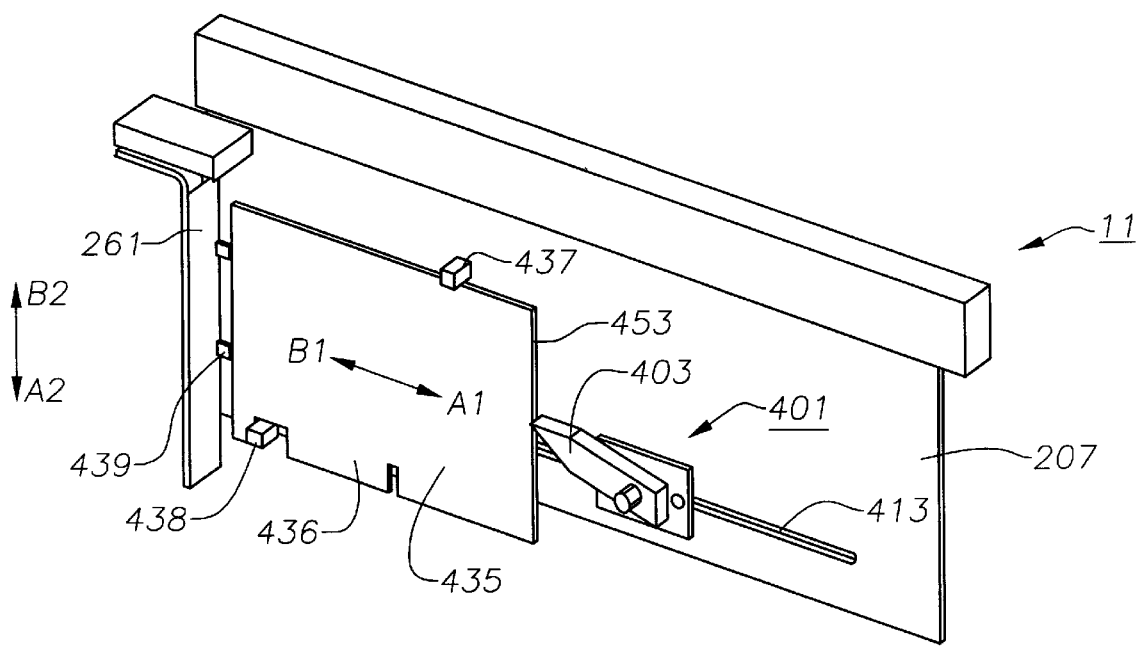
FIG. 10 is an isometric view of a smaller version of the daughterboard of FIG. 4 mounted in the gripper device of FIG. 4.

Referring now to FIG. 10, card frame 207 has been adapted to allow guidance device 11 to mount daughterboards which are even smaller in size than daughterboard 205. In the embodiment shown, a daughtercard 435 having a motherboard connector 436 on a lower end is mounted to card frame 207 with upper and lower clamps 437, 438 and side clamps 439. Clamps 437, 438 restrict the movement of daughtercard 435 in directions A2, B2 and A1, while clamps 439 restrict its motion in direction B1. ISA I/O bracket 261 is mounted to card frame 207 and guidance device 11. Pawl 403 is shown in the engaged position and operates as described above.

Figure 9:
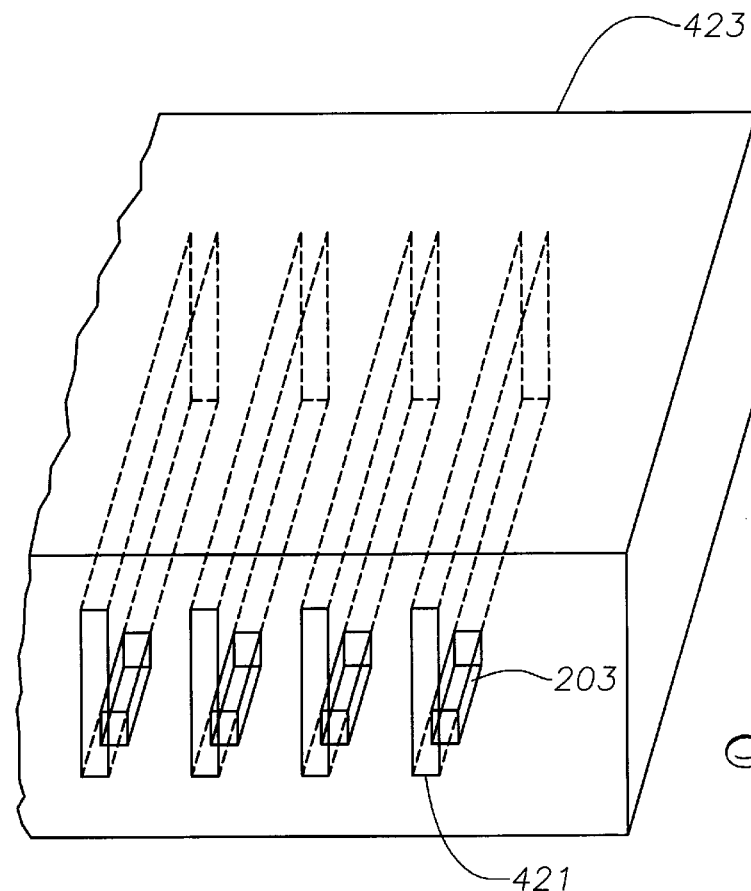
FIG. 9 is an schematic view of an enclosure which is configured with a plurality of access slots, connectors and gripper mechanisms.

Daughterboard 435 is loaded into card frame 207 so that edge 453 abuts point 410. The daughterboard 435 and card frame 207 assembly is then inserted into opening 421 in enclosure 423 (FIG. 9). Guidance device 11 lowers daughterboard 435 toward motherboard 201. When daughterboard 435 is to be removed, guidance device 11 lifts card frame 207 and daughterboard 435, and is assisted in disconnecting motherboard connector 436 by pawl 403 without the removal of enclosure 423. As described above, daughterboard 435 may then be removed from opening 421 and guidance device 11 may be detached and removed.

The invention has advantages. The gripper mechanism alleviates the need to remove the system enclosure when a small daughterboard is installed or removed. The gripper mechanism supports and provides a significant upward force on one edge of a card. The position of the gripper mechanism may be adjusted so that cards of various sizes may be accommodated.

While the invention has been shown or described in only some of its forms, it should be apparent to those skilled in the art that it is not so limited, but is susceptible to various changes without departing from the scope of the invention.

We claim:

1. An electrical apparatus for housing a circuit board having an electrical connector on a base edge and a first edge which is perpendicular to the base edge, comprising in combination:

an enclosure having a base and an opening which is perpendicular to the base;

a motherboard connector mounted in the enclosure and facing in a direction parallel to and away from the base, the motherboard connector engaging the electrical connector when the circuit board is moved toward the base;

a gripping mechanism located within the enclosure and having a movable portion which has a free end adapted to engage the first edge of the circuit board, the free end of the movable portion of the gripping mechanism being movable relative to the enclosure; and wherein The gripping mechanism comprises a base plate which is mounted in the enclosure, the movable portion being pivotally mounted by a pivot pin to the base plate.

2. The electrical apparatus of claim 1 wherein the movable portion has serrations on the free end, and wherein the free end is curved so as to provide a variable contact point with the first edge of the circuit board.

3. The electrical apparatus of claim 1 wherein the base plate may be adjustably mounted at various positions in the enclosure for enabling the gripping mechanism to accommodate circuit boards having various lengths.

4. An electrical apparatus for housing a circuit board having an electrical connector on a base edge and a first edge which is perpendicular to the base edge, comprising in combination;

an enclosure having a base and an opening which is perpendicular to the base;

a motherboard connector mounted in the enclosure and facing in a direction parallel to and away from the base, the motherboard connector engaging the electrical connector when the circuit board is moved toward the base;

a gripping mechanism located within the enclosure and having a movable portion which has a free end adapted to engage the first edge of the circuit board, the free end of the movable portion of the gripping mechanism being movable relative to the enclosure; and a removable guidance device which is mountable in the enclosure for guiding and aligning the electrical connector of the circuit board into engagement with the motherboard connector, and wherein the gripping mechanism is mounted to the guidance device.

5. An electrical apparatus for housing a circuit board having an electrical connector on a base edge and a first edge which is perpendicular to the base edge, comprising in combination:

an enclosure having a base and an opening which is perpendicular to the base;

a motherboard connector mounted in the enclosure and facing in a direction parallel to and away from the base, the motherboard connector engaging the electrical connector when the circuit board is moved toward the base;

a gripping mechanism located within the enclosure and having a movable portion which has a free end adapted to engage the first edge of the circuit board, the free end of the movable portion of the gripping mechanism being movable relative to the enclosure; and wherein the movable portion of the gripping mechanism has serrations on the free end for enhancing the ability of the gripping mechanism to grip the first edge of the circuit board.

6. An electrical apparatus for housing a circuit board having an electrical connector on a base edge and a first edge which is perpendicular to the base edge, comprising in combination:

an enclosure having a base and an opening which is perpendicular to the base;

a motherboard connector mounted in the enclosure and facing in a direction parallel to and away from the base, the motherboard connector engaging the electrical connector when the circuit board is moved toward the base;

a gripping mechanism located within the enclosure and having a movable portion which has a free end adapted to engage the first edge of the circuit board, the free end of the movable portion of the gripping mechanism being movable relative to the enclosure; and wherein the gripping mechanism comprises a base plate which is adjustably mounted in the enclosure at various positions for enabling the gripping mechanism to accommodate circuit boards having various lengths, the movable portion being movably mounted to the base plate.

7. An electrical apparatus for housing a circuit board having an electrical connector on a base edge and a first edge which is perpendicular to the base edge, comprising in combination:

an enclosure having a base and an opening which is perpendicular to the base;

a motherboard connector mounted in the enclosure and facing in a direction parallel to and away from the base, the motherboard connector engaging the electrical connector when the circuit board is moved toward the base;

a gripping mechanism located within the enclosure and having a movable portion which has a free end adapted to engage the first edge of the circuit board, the free end of the movable portion of the gripping mechanism being movable relative to the enclosure; and a card frame for supporting circuit boards having various sizes, and wherein the gripping mechanism is mounted to the card frame.

8. An electrical apparatus for housing a circuit board having an electrical connector on a base edge and a first edge which is perpendicular to the base edge, comprising in combination:

an enclosure having a base and an opening which is perpendicular to the base;

a motherboard connector mounted in the enclosure and facing in a direction parallel to and away from the base, the motherboard connector engaging the electrical connector when the circuit board is moved toward the base;

a removable guidance device having a card frame and which is mountable in the enclosure for guiding and aligning the electrical connector of the circuit board into engagement with the motherboard connector;

a gripping mechanism having a base plate which is mounted on the card frame and a movable portion which is pivotally mounted to the base plate, the movable portion having a free end adapted to engage the first edge of the circuit board when the circuit board is attached to the card frame, and the free end being biased toward the motherboard connector.

9. The electrical apparatus of claim 8 wherein the movable portion of the gripping mechanism comprises a pawl which is pivotally mounted to the base plate for movement about a pivot pin that is perpendicular to the base.

10. The electrical apparatus of claim 8 wherein the free end of the movable portion of the gripping mechanism has serrations for enhancing the ability of the gripping mechanism to grip the first edge of the circuit board.

11. The electrical apparatus of claim 8 wherein the base plate is adjustably mounted to the card frame for positioning the movable portion at various distances from the opening for enabling the gripping mechanism to engage circuit boards having various lengths.

12. The electrical apparatus of claim 8 wherein the free end of the movable portion has serrations, the free end being curved so as to provide a variable contact point with the first edge of the circuit board.

13. The electrical apparatus of claim 8 wherein the base plate of the gripping mechanism is adjustably mounted to a slot in the card frame that is parallel with the base.

14. A method for mounting a circuit board inside an enclosure of an electrical system, the circuit board having an electrical connector on a base edge and a first edge which is perpendicular to the base edge, the enclosure having a base and an opening which is perpendicular to the base, comprising:

(a) providing a motherboard connector and a gripping mechanism mounted to a card frame, the motherboard connector facing in a direction parallel to and away from the base, and the gripping mechanism having a movable portion which has a free end;

(b) attaching the circuit board to the card frame so that the first edge abuts the free end of the movable portion of the gripping mechanism;

(c) inserting the circuit board and card frame assembly through the opening of the enclosure; and then (d) moving the circuit board toward the base so that its electrical connector engages the motherboard connector while the free end of the movable portion of the gripping mechanism remains in engagement with the first edge of the circuit board; and wherein the circuit board may be removed from the enclosure by reversing steps (c) and (d) and wherein the free end of the gripping mechanism applies a force on the first edge of the circuit board which assists in the removal of the electrical connector from the motherboard connector.

15. A method for mounting a circuit board inside an enclosure of an electrical system, the circuit board having an electrical connector on a base edge and a first edge which is perpendicular to the base edge, the enclosure having a base and an opening which is perpendicular to the base, comprising:

(a) providing a motherboard connector and a gripping mechanism mounted to a card frame, the motherboard connector facing in a direction parallel to and away from the base, and the gripping mechanism having a movable portion which has a free end;

(b) attaching the circuit board to the card frame so that the first edge abuts the free end of the movable portion of the gripping mechanism;

(c) inserting the circuit board and card frame assembly through the opening of the enclosure; and then (d) moving the circuit board toward the base so that its electrical connector engages the motherboard connector while the free end of the movable portion of the gripping mechanism remains in engagement with the first edge of the circuit board; and wherein step (a) comprises mounting the movable portion of the gripping mechanism about a pivot pin which is mounted to the card frame.

16. A method for mounting a circuit board inside an enclosure of an electrical system, the circuit board having an electrical connector on a base edge and a first edge which is perpendicular to the base edge, the enclosure having a base and an opening which is perpendicular to the base, comprising:

(a) providing a motherboard connector and a gripping mechanism mounted to a card frame, the motherboard connector facing in a direction parallel to and away from the base, and the gripping mechanism having a movable portion which has a free end;

(b) attaching the circuit board to the card frame so that the first edge abuts the free end of the movable portion of the gripping mechanism;

(c) inserting the circuit board and card frame assembly through the opening of the enclosure; and then (d) moving the circuit board toward the base so that its electrical connector engages the motherboard connector while the free end of the movable portion of the gripping mechanism remains in engagement with the first edge of the circuit boards; and biasing the free end of the movable portion toward the motherboard connector.

17. A method for mounting a circuit board inside an enclosure of an electrical system, the circuit board having an electrical connector on a base edge and a first edge which is perpendicular to the base edge, the enclosure having a base and an opening which is perpendicular to the base, comprising:

(a) providing a motherboard connector and a gripping mechanism mounted to a card frame, the motherboard connector facing in a direction parallel to and away from the base, and the gripping mechanism having a movable portion which has a free end;

(b) attaching the circuit board to the card frame so that the first edge abuts the free end of the movable portion of the gripping mechanism;

(c) inserting the circuit board and card frame assembly through the opening of the enclosure; and then (d) moving the circuit board toward the base so that its electrical connector engages the motherboard connector while the free end of the movable portion of the gripping mechanism remains in engagement with the first edge of the circuit board; and wherein step (a) comprises adjustably mounting the gripping mechanism at various positions on the card frame for enabling the gripping mechanism to engage circuit boards having various lengths.

* * * * *